(12) United States Patent
Li et al.

(10) Patent No.: US 11,729,897 B1
(45) Date of Patent: Aug. 15, 2023

(54) ELECTROMAGNETIC SHIELDING STRUCTURE FOR AN OVERMOLDED PRINTED CIRCUIT BOARD

(71) Applicant: Meta Platforms Technologies, LLC, Menlo Park, CA (US)

(72) Inventors: Qiuming Li, Palo Alto, CA (US); Ming Lei, San Jose, CA (US); Colden Niles Eldridge, Oakland, CA (US); Yeonsoo Ko, Mountain View, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/850,721

(22) Filed: Jun. 27, 2022

(51) Int. Cl.
*H05K 9/00* (2006.01)
*H05K 1/02* (2006.01)

(52) U.S. Cl.
CPC ......... *H05K 1/0216* (2013.01); *H05K 9/0032* (2013.01); *H05K 2201/0715* (2013.01); *H05K 2201/10371* (2013.01)

(58) Field of Classification Search
CPC .................................................. H05K 9/0037
See application file for complete search history.

(56) References Cited

U.S. PATENT DOCUMENTS

2014/0071634 A1* 3/2014 Pakula ................ H01M 50/224
429/185

* cited by examiner

*Primary Examiner* — Hung V Ngo
(74) *Attorney, Agent, or Firm* — Greenberg Traurig, LLP

(57) ABSTRACT

The disclosed hybrid shielding structure may include a printed circuit board (PCB) that is to be overmolded with at least a portion of molding compound. The PCB may include various electronic components disposed thereon. The hybrid shielding structure may also include conductive trenches and conductive fences that are disposed on the PCB. The conductive trenches and the conductive fences may provide an electromagnetic shield for at least a portion of the electronic components of the PCB. The hybrid shielding structure may further include a conformal shielding and a PCB ground flood and ground layers. Various other systems, electronic devices, apparatuses, and methods of manufacturing are also disclosed.

20 Claims, 9 Drawing Sheets

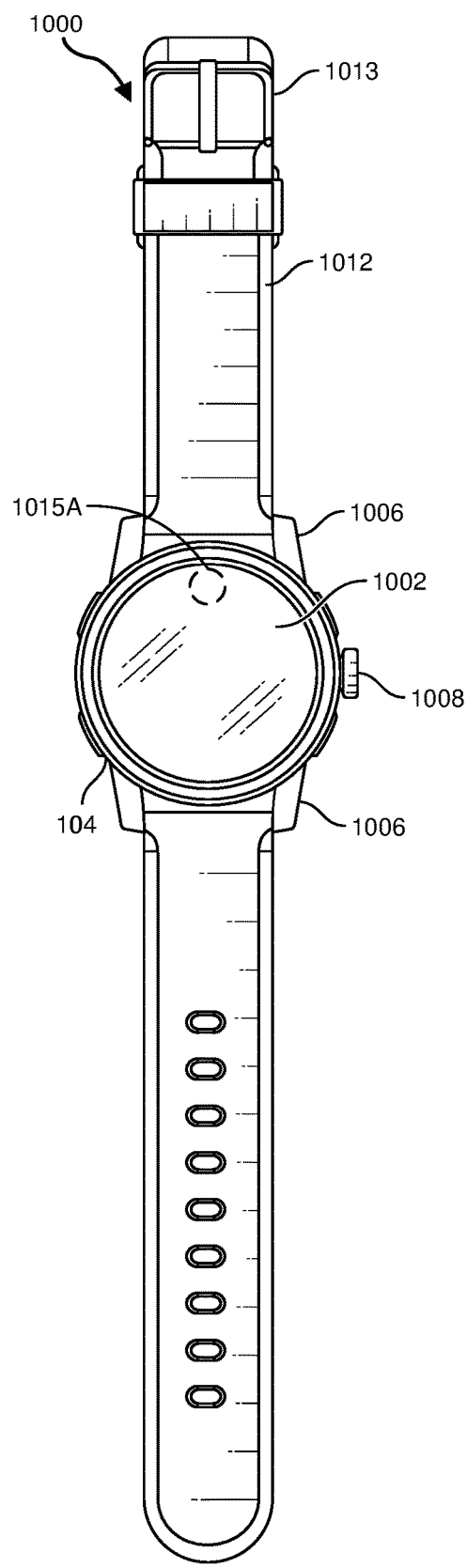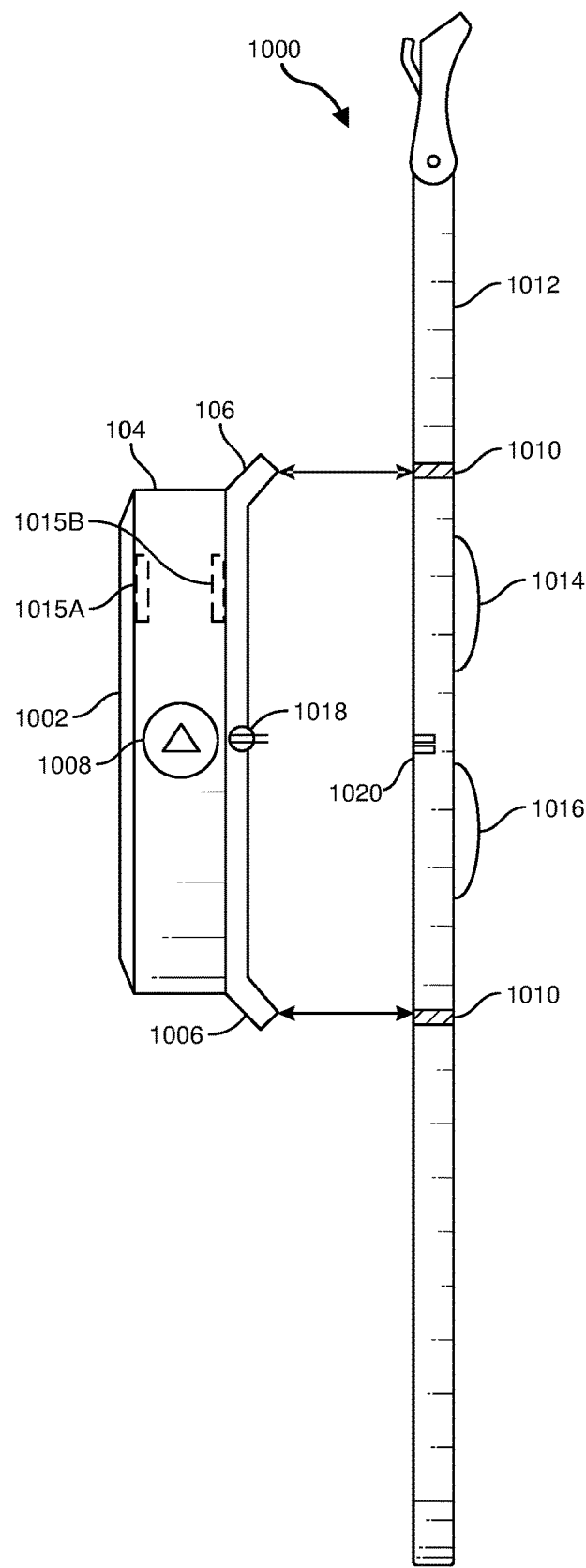
FIG. 10A    FIG. 10B

ELECTROMAGNETIC SHIELDING STRUCTURE FOR AN OVERMOLDED PRINTED CIRCUIT BOARD

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIGS. 10A and 10B are illustrations of an exemplary smartwatch that may be used in connection with embodiments of this disclosure.

Figure 1:
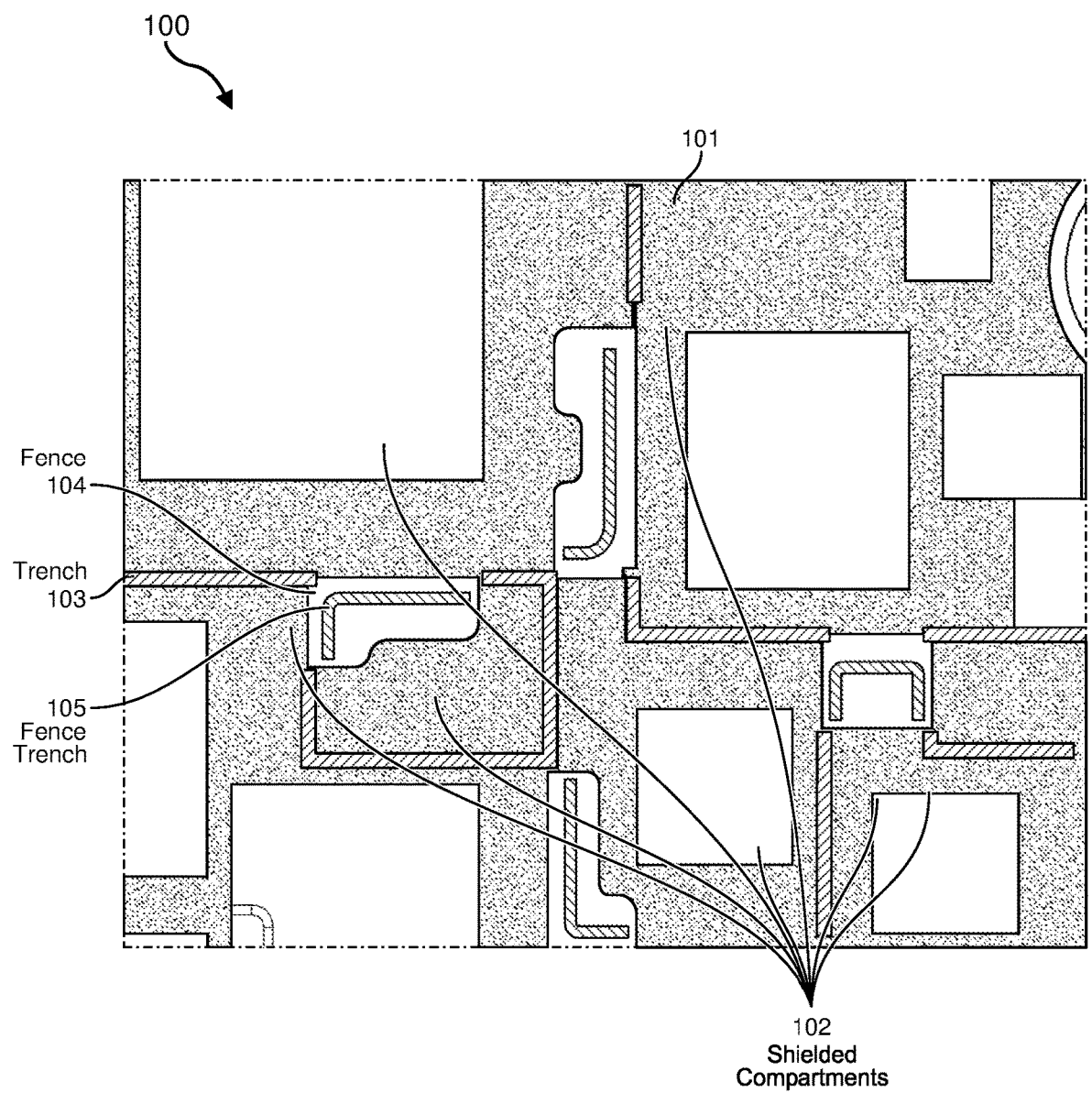
FIG. 1 is an illustration of a printed circuit board that includes conductive trenches and/or conductive fences.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to a hybrid electromagnetic shielding structure that is designed for operation in an overmolded printed circuit board (PCB). As used herein, the term "overmolding" may refer to a process that applies a subsequent molding over a previously molded or packaged module. This packaged module may include a PCB or a substrate and various electronic components that have been mounted to the PCB or to the substrate. In some cases, that PCB package may then be overmolded with a protective layer. This overmold layer is typically applied as a molding compound from one side of the PCB to the other side. As such, the molding compound needs to be able to flow across the PCB and its embedded components. At least some of these components embedded in the PCB may require electrical shielding. For instance, radio frequency (RF) components including antennas, antenna feeds, RF integrated circuit (RFIC), RF front end modules, filters, RF switches, and other similar components may be sensitive to electromagnetic radiation, and may need at least some amount of shielding or isolation from other components that may emit such radiation noise or interference. Accordingly, various shielding techniques may be implemented to protect these RF sensitive components from other radiating components.

In order to provide shielding components and still allow molding compound to be overmolded onto a PCB, some PCBs have attempted to channel the molding compound by using low-profile, metal-filled trenches to provide electromagnetic shielding. The embodiments described herein may implement conductive fences, in addition to or at the exclusion of metal-filled trenches, to provide electromagnetic shielding. These conductive fences may include different-sized openings in them to allow molding compound to flow through the fences. As will be described further below, the openings may be optimized both in the direction of the mold flow and in the directions perpendicular to the mold flow. In some cases, for example, conductive fences positioned in parallel with the mold flow may be solid and, as such, may have no openings. On the other hand, fences that are perpendicular to the mold flow may have many different openings of different sizes. The size of the openings may depend on which electronic components are near the fences. Larger openings may allow for better mold flow but may provide less shielding, while smaller openings may provide poorer mold flow, but better electromagnetic shielding.

At least some of the embodiments described herein may include both conductive trenches and conductive fences. This combination of conductive fences and conductive trenches may provide a hybrid EM shielding structure that provides different levels of shielding to different components, while still providing optimal overmold flow. Additionally or alternatively, the embodiments herein that implement conductive fences may be manufactured more quickly than PCBs that implement conductive trenches. Indeed, as will be explained further below, PCBs that implement conductive trenches typically fill those trenches with silver epoxy, which is expensive and takes a relatively long time to be properly mounted on the PCB. Conductive fences, on the other hand, may be formed from solid metal (or other conductive material) and may be applied to the PCB using surface mount technology. Thus, each conductive fence that replaces a conductive trench may reduce the amount of manufacturing time needed to produce an overmolded PCB. Still further, long conductive trenches may cause the PCB to warp and crack during the molding compound curing process. Conductive fences may be inserted to break up these longer conductive trenches and form a hybrid shielding structure to maintain PCB flatness. These embodiments will be described in greater detail below with reference to the illustrations in FIGS. 1-9.

Features from any of the embodiments described herein may be used in combination with one another in accordance with the general principles described herein. These and other embodiments, features, and advantages will be more fully understood upon reading the following detailed description in conjunction with the accompanying drawings and claims.

FIG. 1 illustrates an embodiment of a hybrid shielding structure 100 that includes conductive fences and conductive trenches. Although it will be recognized that the embodiments herein may include solely conductive fences, most of the embodiments described herein will include at least one conductive fence and at least one conductive trench. Moreover, while many of the embodiments described herein refer to PCBs, other System In a Package (SIP) circuit boards or System on a Chip (SOC) circuit boards, or other similar integrated circuits may use the hybrid shielding structure described below.

As the term is used herein, a "conductive fence" may refer to a solid piece of conductive material that is attached to a PCB and that provides an electromagnetic shield for electronic components. Because conductive fences are solid pieces of conductive material (e.g., metal such as copper or stainless steel, etc.), the manufacturing process may remove some of the conductive material to create openings (alternatively, the fences may be formed to include these openings). The openings may be strategically positioned and sized to provide maximal electromagnetic shielding while still allowing flow of molding compound. "Conductive trenches," as the term is used herein, may refer to grooves or channels that are laser cut into the molding compound of the overmolded PCB and later filled with a conductive material (e.g., metal such as silver epoxy). Because these conductive trenches hold metal that is, at least temporarily, liquid, these conductive trenches do not allow for openings of any size. Moreover, these conductive trenches cannot be applied to the PCB using surface mount technology.

Conductive fences may be formed in substantially any shape or size, and may be placed substantially anywhere on the PCB. In some cases, the conductive fences may be formed in L-shapes, J-shapes, U-shapes, straight lines, or other shapes. Indeed, as shown in FIG. 1, the conductive fence 104 may be formed more in an L-shape, while the conductive trench 103 is formed in a straight line. In some cases, as shown in greater detail in FIG. 2A, a conductive fence may include a sidewall portion that electrically contacts (e.g., is soldered to) the surface layer with exposed copper of the PCB and runs vertically away from the top surface of the PCB. The conductive fences may also include a raised flat portion that curves off of the vertical sidewall portion and forms a flat surface that is parallel to and raised above the top surface of the PCB (e.g., 201 of FIG. 2A). At least in some cases, this raised flat portion may be designed for "pick and place" positioning during the component mounting stage in which electronic components are surface mounted to the PCB. Using such a design may allow for quicker placement and quicker manufacturing of the overmolded PCB. Moreover, the location and shape of the raised flat portion along the conductive fence may be optimized to minimize conductive loading effects on the components underneath the ledge.

In some cases, the top, flat surface of the raised conductive fence may, itself, include a trench portion. Accordingly, as shown in FIG. 1, the conductive fence 104 may include a fence trench 105 that may be laser cut into the raised, flat portion of the conductive fence 104. In some cases, the fence trench 105 may be shaped differently (e.g., 105 is L-shaped), or may be deeper or wider than a conductive trench (e.g., 103), or may include different conductive filler materials that fill the conductive trench. As such, the fence trench 105 may cut into the conductive fence 104 and may have characteristics that are different than those of the conductive trench 103.

In some cases, the conductive fences (e.g., 104) and/or the fence trenches 105 may be configured to contact a conformal coating. This conformal coating may result from the overmold process that overmolds the PCB after the electronic components are put into place (e.g., using surface mount technology). In at least some cases, some or all of the conformal coating may be conductive, resulting in a coating that may connect the conductive fences and/or the fence trenches that are etched into the fences and are filled with conductive material. This coating may further connect to ground layer interconnections that may extend to the side edge of the PCB. In this manner, the conformal coating may additionally contribute to the hybrid shielding structure of the PCB 101.

The hybrid shielding structure described herein may include different characteristics that optimize tradeoffs between surface mount technology (SMT) compatibility, overmolding compatibility, shielding effectiveness, mechanical structuring, and other constraints. In some cases, the hybrid shielding structure may include conductive fences that are formed from sheet metal, for example, or copper with nickel plating. The shielding structure may also include laser-etched conductive trenches filled with metal (e.g., silver epoxy), laser-etched conductive trenches on the top of (at least some of) the conductive fences, a conformal coating that may be applied using sputtering or other techniques, and a conductive ground flood and/or ground layers on the PCB. The combination of these shielding structures may form a Faraday cage to shield the circuit board with partition walls that shield or electromagnetically isolate individual subsystems or components from each other (e.g., shielded compartments 102 on PCB 101 of FIG. 1). In some embodiments, conductive trenches may be prioritized to achieve potentially higher electromagnetic isolation.

In some cases, conductive trenches may be removed or omitted from the PCB, and conductive fences may instead be used. The use of conductive fences may avoid or reduce substrate cracking and/or warping. Indeed, as noted above, longer trenches that may cause warping or cracking of the PCB during the molding compound curing process may be replaced with conductive fences. These conductive fences may be added to the PCB to break up the long conductive trenches and may form a hybrid shielding structure. This hybrid shielding structure may maintain PCB flatness by replacing conductive trenches with conductive fences or at least by reducing the length of conductive trenches on the PCB. Still further, the hybrid shielding structure may have optimized openings, closings, and interconnections that are optimized in size, shape, and/or position to provide the most amount of shielding while still allowing space for molding compound to flow over the printed circuit board.

In this manner, a hybrid shielding structure 100 may include one or multiple different components that combine to create various shielded compartments 102. Each PCB may include many different shielded compartments, some of which may be more electrically shielded than others. That is, some shielded compartments 102 may be more isolated or more shielded from electromagnetic radiation than other compartments. This may be due to different characteristics of the conductive trenches and the conductive fences including size, shape, connections to the conformal coating, or the size or shape of openings and closings in the conductive fences and trenches.

In one embodiment, a hybrid shielding structure 100 may include a printed circuit board (PCB) 101 that is to be overmolded with at least some amount of molding compound (e.g., plastic, glass, polymers, etc.). The PCB may include different electronic components disposed thereon including antennas, tuners, amplifiers, signal processors, impedance matching circuits, processors, memory, batteries, or other components. The hybrid shielding structure may further include various conductive trenches (e.g., 103) disposed on the PCB 101, as well as different conductive fences 104. At least in some cases, these conductive fences 104 may rise at least some distance (e.g., a specified minimum distance of 0.1 mm, 0.2 mm, 0.5 mm, 1 mm, etc.) above the surface of the PCB 101. Because the conductive trenches, on the other hand, are on the same plane as the PCB (or are cut into the molding compound of the overmolded PCB) and because the conductive fences are raised above the surface of the PCB, the conductive fences 104 may provide additional electromagnetic shielding for at least some portion of an electronic component on the PCB 101. In some cases, the electromagnetic shield may fully electromagnetically isolate components or groups of components, while in other cases, the shield may only partially isolate a given electronic component or group of components. Various architectures of these electromagnetic shields are shown in embodiment 200A of FIG. 2A.

Figure 2A:
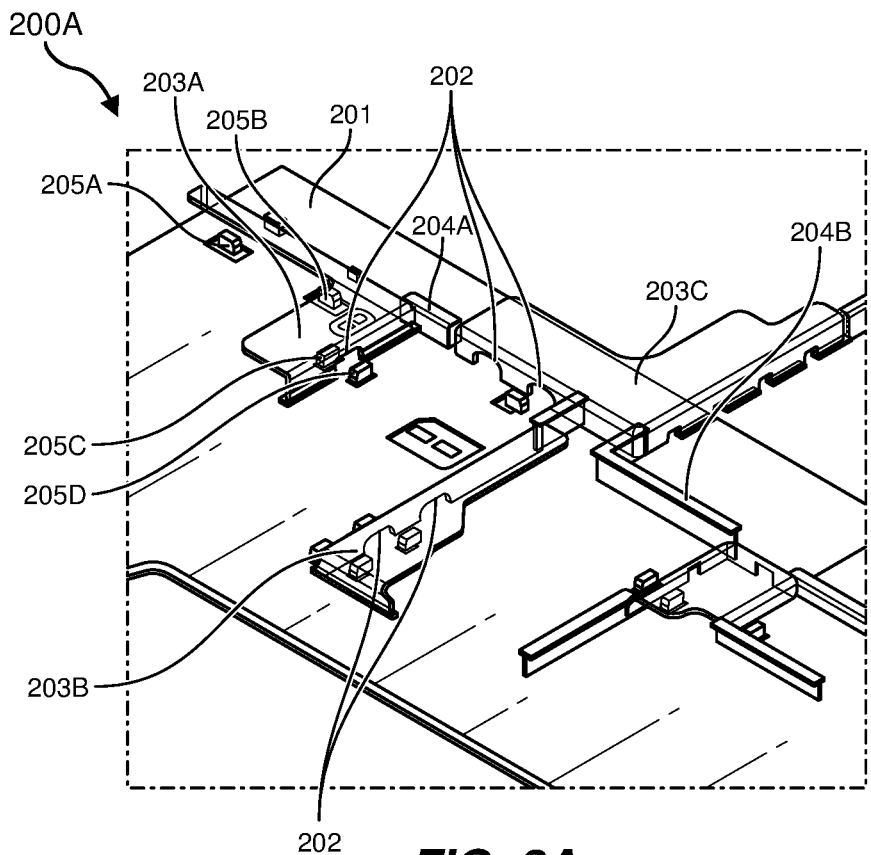
FIGS. 2A and 2B are illustrations of printed circuit boards that include conductive trenches and/or conductive fences that have openings therein.

FIG. 2A illustrates a PCB 201 that includes multiple different electronic components, as well as various shapes and sizes of conductive fences and conductive trenches. For instance, the PCB 201 may include conductive trenches (e.g., 204A and 204B) as well as conductive fences (e.g., 203A-203C). The L-shaped conductive fence 203A, for example, may shield various electronic components including component 205A. The L-shaped conductive fence 203A may attach to the PCB 201 on the right side and the bottom side of the fence and may extend upwards along a short vertical portion. The conductive fence 203A may then curve toward the top and to the left in a raised portion. This raised portion may be elevated above the PCB and may lie over one or more electronic components (e.g., 205B). The conductive fence 203A may include an opening 202. The opening may allow two components to be connected to each other (e.g., 205C and 205D), and/or may allow an RF trace or other element to run therethrough. Other conductive fences (e.g., 203B, 203C, and others) may also be positioned on the PCB 201 to electromagnetically shield other electronic components. The various openings 202 in the different conductive fences may have different sizes or shapes, as shown in FIG. 2B.

Figure 2B:
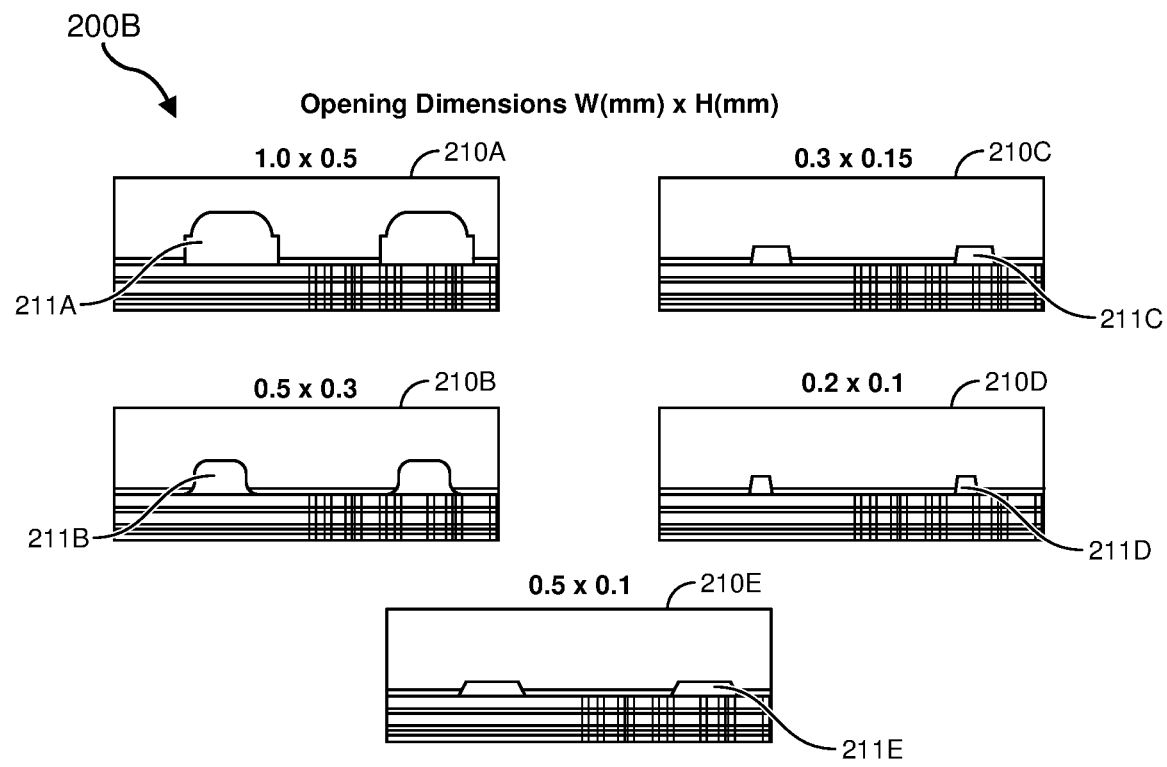

FIG. 2B illustrates an embodiment 200B of different sizes and shapes for openings in the conductive fences. These openings may be stamped, etched, laser cut, or otherwise formed into the example conductive fences 210A-210E. For instance, the openings 211A in the conductive fence 210A may be dome shaped with chamfered edges. In this example embodiment, the openings 211A may be 1.0 mm wide by 0.5 mm high. Of course, with each of the embodiments described herein, different sizes larger or smaller than those shown in FIG. 2B may be used. In conductive fence 210B, an alternative domed-shaped opening 211B may be provided that is 0.5 mm wide by 0.3 mm high. The opening 211C in conductive fence 210C may be trapezoidal and may be 0.3 mm wide and 0.15 mm high, while the trapezoidal opening 211D in conductive fence 210D may be 0.2 mm wide by 0.1 mm high. Still further, the trapezoidal opening 211E in the conductive fence 210E may be 0.5 mm wide by 0.1 mm high.

In some cases, the size and/or shape of the openings may be optimized for certain scenarios or for use with specific components. For example, the dimensions of the conductive fence opening may be optimized in the X and Y directions to balance shielding effectiveness and mold flow compatibility. For instance, as noted above, larger openings may have better mold flow but comparatively worse shielding effectiveness. Smaller openings may have poorer mold flow but comparatively better shielding effectiveness. Thus, the embodiments herein may determine which electronic components are to be shielded in each section of the PCB, and may size the openings to provide at least a minimum level of shielding that is specific to each of the components. Accordingly, at least in some examples, larger openings may be implemented in conductive fences that are positioned in proximity to RF components whose sensitivity to electromagnetic interference is below a specified threshold value, and smaller openings may be implemented in conductive fences that are positioned in proximity to sensitive RF components whose sensitivity to electromagnetic interference is above a specified threshold value. For RF components that are extremely sensitive, openings may be omitted entirely on at least a section of the conductive fence.

In some cases, different shapes or sizes for the openings may provide different shielding characteristics that are better suited for certain components. Thus, depending on which components are placed on the PCB, each conductive fence may include openings that are sized and shaped to provide the shielding characteristics needed by the nearby components. Still further, in at least some embodiments, the sizes and shapes of the openings 211A-211E in the conductive fences 210A-210E may be selected based on solderability (e.g., which openings will allow for each leg of the conductive fences to be soldered without solder skip and/or will allow for soldering points to be added), SMT compatibility (e.g., which openings will allow the conductive fences to be mounted to the PCB using surface mount technology), mold flow moldability (e.g., compatibility with various overmolding techniques), shielding effectiveness (e.g., how much electromagnetic isolation the conductive fences need to provide), or other characteristics.

Figure 3:
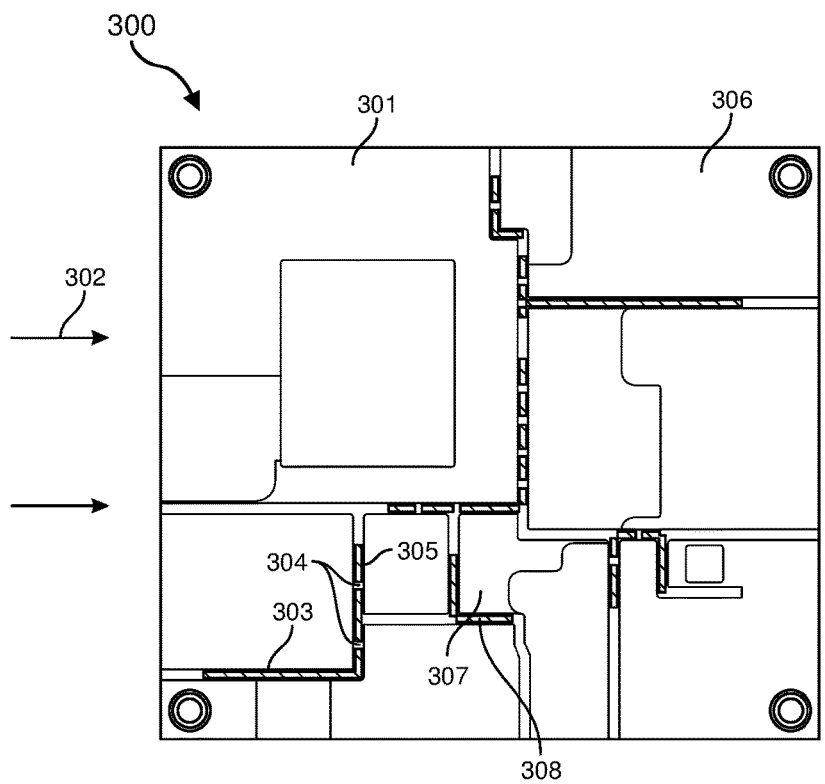
FIG. 3 is an illustration of a printed circuit board that includes openings perpendicular to the mold flow direction and closings parallel to the mold flow direction.

FIG. 3 illustrates an embodiment 300 of a PCB 301 that includes various electronic components, as well as conductive fences and/or conductive trenches that provide electromagnetic shielding for these components. The conductive fences (e.g., 305) may be positioned in a manner that allows for molding compound to flow over the components. Moreover, the conductive fences 305 may have openings 304 that allow the molding compound to flow more easily over the PCB. For instance, in some cases, the molding compound may be a liquid that is applied from left to right, as indicated by flow direction arrows 302. The conductive fence 305 may include openings 304 in the direction perpendicular to the direction of mold flow to allow the molding compound to flow more easily in that direction. The conductive fence 305 may include solid portions without openings in the direction parallel to the mold flow. Thus, in this case, because the molding compound flows from left to right, in general, conductive fence segments that are perpendicular to the mold flow may include more openings or larger openings, while conductive fence segments (even on the same conductive fence) that are parallel to the mold flow may include fewer (or no) openings or smaller openings.

While these principles may be applied generally, it should be noted that some electronic components may require additional electromagnetic shielding. In such cases, conductive fences may be implemented (e.g., 308) that do not include openings even in the direction perpendicular to mold flow. The various conductive fences with or without openings may provide shielding for different areas (e.g., 306 or 307) or for specific components (e.g., RF antennas). In some cases, the openings may include sufficient space to allow a conductive trace or other connecting element to run underneath the opening.

Figure 4A:
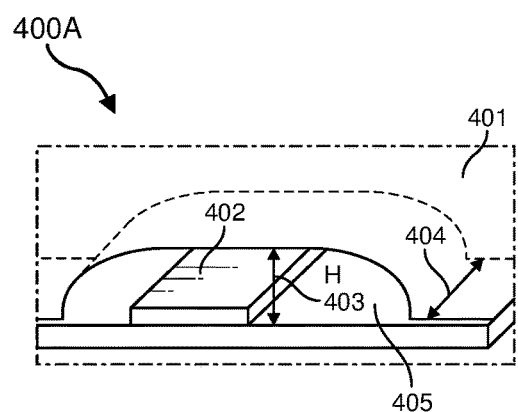
FIGS. 4A and 4B are illustrations of conductive fence openings through which conductive radio frequency (RF) traces may run.
Figure 4B:
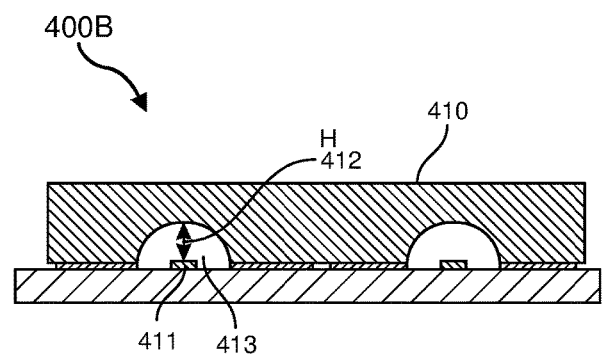

For example, as shown in embodiment 400A of FIG. 4A, a conductive fence 401 with an opening 405 may have a trace 402 running through the opening. In this case, the opening may have a minimum specified height 403 and width 404 that allow use of the trace 402. In some cases, the trace may be part of an antenna and may be a transmission line for the antenna. As such, the conductive fence may need to be set at a specific distance away from the trace to avoid interference and to provide impedance control of the transmission line. As shown in embodiment 400B of FIG. 4B, the opening 413 in the conductive fence 410 may be high enough (as indicated by height 412) and/or wide enough to provide the trace 411 sufficient space to operate at a proper transmission mode.

Figure 5:
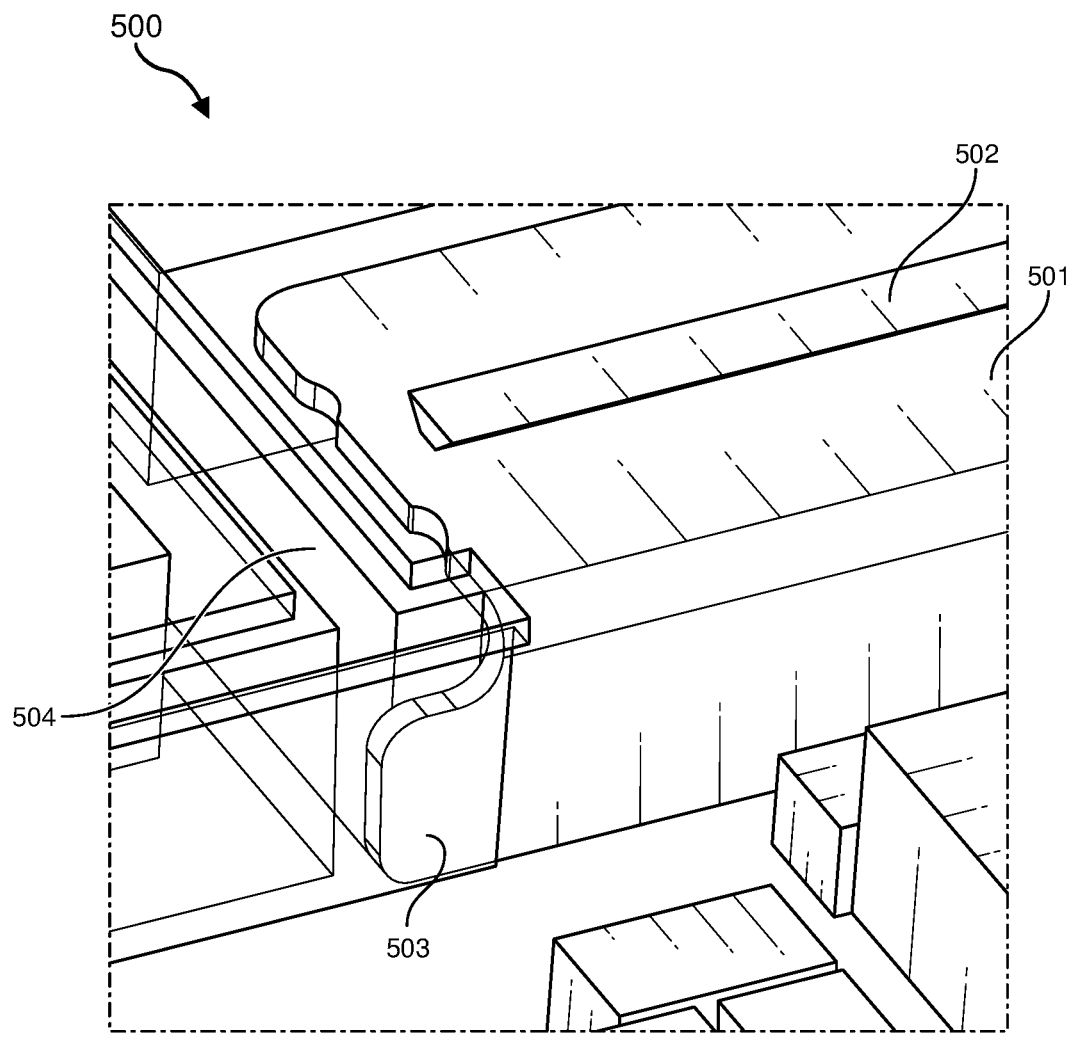
FIG. 5 is an illustration of an interconnect between a conductive fence and a conductive trench.
Figure 6A:
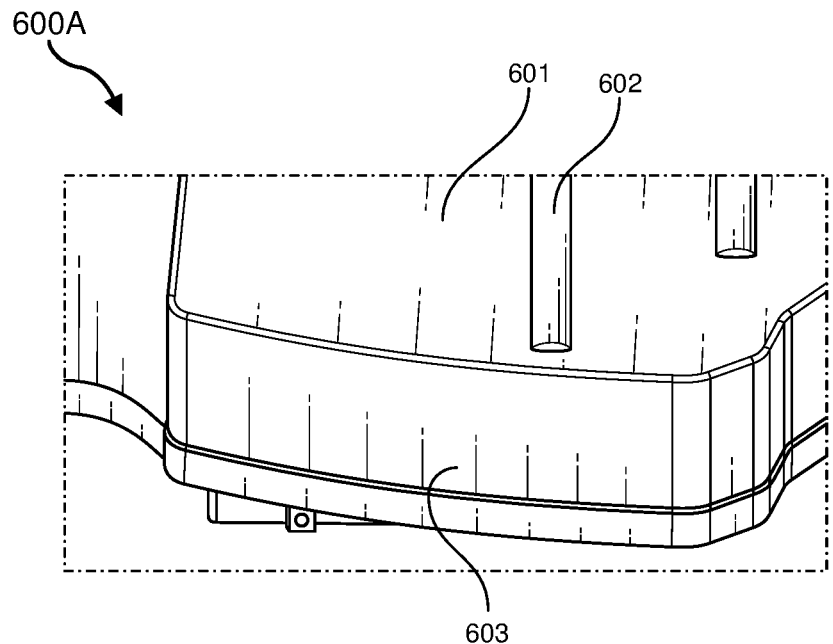
FIGS. 6A and 6B are illustrations of interconnections between a printed circuit board side having extended ground layers that are exposed to the side edge and a conformal coating.
Figure 6B:
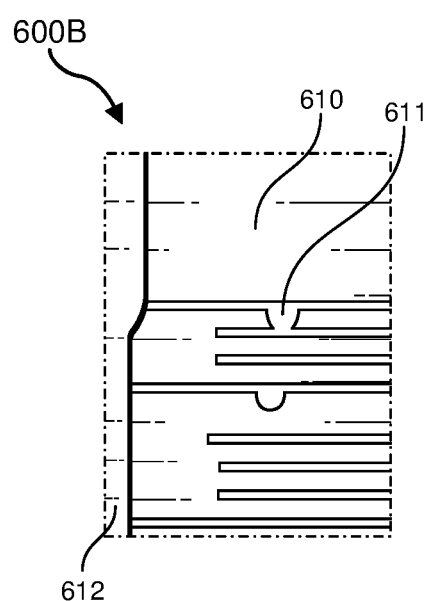

FIG. 5 illustrates an embodiment 500 of an interconnection between a conductive fence 501 and a conductive trench 504. As noted above, the conductive fence 501 may include a vertical side portion that bends or curves into a horizontal, flat portion. In this embodiment, the vertical side portion may include an extended interconnecting portion 503 that makes electrical contact with the conductive trench 504. Although not shown as being filled with conductive material (e.g., metal), the conductive trench 504 may electrically contact the extended interconnecting portion 503. In this manner, the conductive fence 501 and the conductive trench 504 may combine to create a hybrid electromagnetic shield that may provide shielding or isolation to electronic components.

In some cases, the conductive fence 501 may include a trench 502 formed into a top portion thereof. This trench 502 may be laser cut or etched or otherwise formed into the solid conductive fence 501. The trench 502 formed in the top portion of the conductive fence 501 may itself be filled with a conductive material. This conductive metal may be configured to electrically connect to a conformal coating. Indeed, in embodiments where molding compound is applied to a PCB, the hybrid shielding structure that includes the conductive fence 501, the conductive trench 504, and/or the trench 502 cut into the conductive fence 501 may form a conformal outer coating for the hybrid shielding structure. In some cases, the conformal outer coating may electrically link multiple conductive fences on the PCB. In such cases, the trench 502 in the top portion of the conductive fence 501 may electrically contact the conformal outer coating, and may connect other conductive fences to create a shield that covers many portions of the PCB.

In some embodiments, the PCB may include a conductive ground layer. This conductive ground layer may be electrically connected to the conformal outer coating through the conductive fences or through a side connection on the PCB. Indeed, as shown in embodiments 600A and 600B of FIGS. 6A & 6B, a PCB 601 may include a conductive ground layer 603 that extends to the edge of the PCB. The PCB 601 may also have conductive trenches 602 or other components that extend fully or close to the edge. As can be seen in PCB 610 of FIG. 6B, some conductive ground vias 611 may extend to the edge 612 of the PCB, while others do not. At least in some cases, ground vias 611 may be used to connect the nonextended layers to the extended layers to form stitching around the perimeter of the PCB. Those layers that extend to the edge of the PCB may be electrically connected by the conformal coating to other conductive fences and trenches that form the hybrid shield. As such, the conformal outer coating may electrically link multiple sides of the PCB 601/610 to each other. Moreover, in cases where an extended interconnecting section 503 is implemented, the interconnecting section 503 may electrically link a ground layer to a conductive trench, to a conductive fence, and/or to a conformal outer coating. These connections may combine to create a hybrid electromagnetic shield against interfering radiation.

In some cases, the conductive fences may have closed seals to provide higher electromagnetic isolation. For example, the conductive fence 303 of FIG. 3 may include closed seals in the direction of the mold flow. These closed seals may provide additional electromagnetic isolation on top of the isolation already provided by the conductive fences. In some embodiments, sensitive components such as RF components and circuits may be placed next to those conductive fences that have closed seals. Moreover, smaller openings may be implemented in conductive fences that are positioned in proximity to radio frequency (RF) components whose sensitivity to electromagnetic interference is above a specified threshold value. Thus, for RF and other components that are highly sensitive to interference, closed seals and smaller openings may be used in those conductive fences that are nearby.

Figure 7:
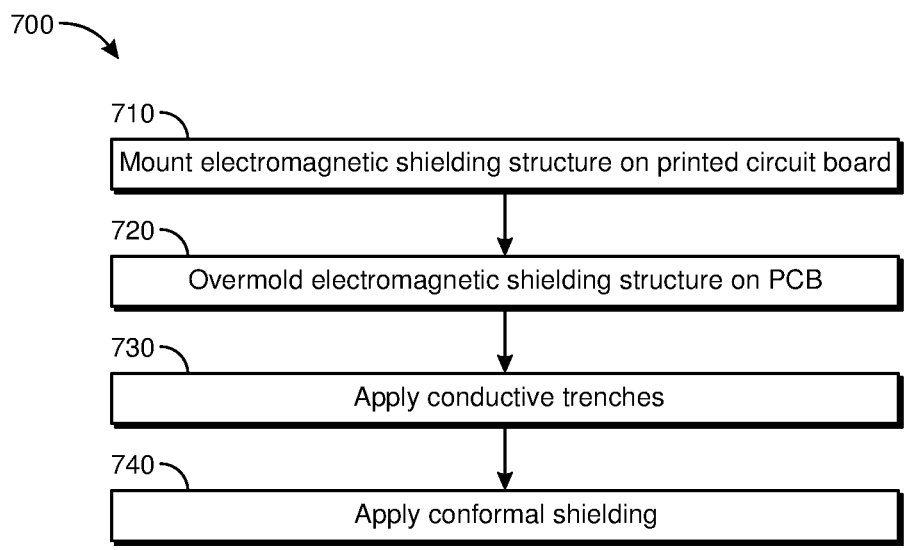
FIG. 7 is a flow diagram of an exemplary method of manufacturing an electromagnetic shielding structure for an overmolded printed circuit board.

FIG. 7 is a flow diagram of an exemplary method of manufacturing 700 for manufacturing or producing a hybrid shielding structure. The steps shown in FIG. 7 may be performed by any suitable manufacturing equipment and/or computer-executable code or computing system, including the systems described herein.

As illustrated in FIG. 7, one or more of the systems described herein may manufacture or otherwise produce an electronic device with a hybrid shielding structure. The method of manufacturing 700 may implement computer systems and/or various pieces of manufacturing equipment to manufacture the electronic device. At step 710, the method 700 may include providing a printed circuit board that is to be overmolded with at least some molding compound. The PCB may include various electronic components disposed thereon. This step may include mounting the hybrid shielding structure (e.g., using surface mount technology) to the PCB including disposing one or more conductive fences. Next, at step 720, the method 700 may include overmolding the hybrid shielding structure that has been mounted on the PCB and, at step 730, laser etching the overmold material on the PCB and disposing one or more conductive trenches on the PCB (e.g., filling the conductive trenches with conductive epoxy). Then, at step 740, the method 700 may include applying a conformal shielding to the overmolded PCB. The conductive trenches and the conductive fences may provide an electromagnetic shield for various electronic components of the PCB.

In some cases, the manufacturing process may take into consideration the level of electromagnetic sensitivity of the surrounding electronic components. In such cases, the conductive trenches and the conductive fences may be placed on the PCB according to the level of RF sensitivity and RF mutual coupling of the adjacent electronic components. The electronic components and/or the conductive fences may be attached to the PCB using surface mount technology or other manufacturing methods. Using conductive fences as electromagnetic shields may save both cycle time and money in the manufacturing process, as fewer conductive trenches (that cannot be applied using SMT) may be used, and because SMT may allow quick placement of conductive fences during production.

The resulting electronic device produced by method 700 may include a support structure and a printed circuit board (PCB) mounted to the support structure. The PCB may be prepared for overmolding with a molding compound, and may include various electronic components disposed thereon. The electronic device may also include one or more conductive trenches disposed on its PCB, as well as one or more conductive fences disposed thereon. These conductive trenches and the conductive fences may provide a hybrid electromagnetic shield for at least some of the electronic components of the PCB.

EXAMPLE EMBODIMENTS

Example 1: A hybrid shielding structure may include a printed circuit board (PCB) that is to be overmolded with at least a portion of molding compound, where the PCB includes one or more electronic components disposed thereon, one or more conductive trenches disposed on the PCB, and one or more conductive fences disposed on the PCB, wherein the conductive trenches and the conductive fences provide an electromagnetic shield for at least a portion of at least one of the electronic components of the PCB.

Example 2: The hybrid shielding structure of Example 1, wherein at least one of the conductive fences includes a trench formed into a top portion thereof.

Example 3: The hybrid shielding structure of any of Examples 1 and 2, wherein the trench formed in the top portion of the conductive fence is filled with a conductive material.

Example 4: The hybrid shielding structure of any of Examples 1-3, wherein the molding compound is applied to the PCB and the hybrid shielding structure forming a conformal outer coating for the hybrid shielding structure.

Example 5: The hybrid shielding structure of any of Examples 1-4, a conductive ground layer that is electrically connected to the conformal outer coating.

Example 6: The hybrid shielding structure of any of Examples 1-5, wherein the conformal outer coating electrically links a plurality of the conductive fences.

Example 7: The hybrid shielding structure of any of Examples 1-6, wherein the conformal outer coating electrically links one or more sides of the PCB to each other.

Example 8: The hybrid shielding structure of any of Examples 1-7, wherein at least one of the conductive trenches is laser cut and filled with a conductive material.

Example 9: The hybrid shielding structure of any of Examples 1-8, wherein at least one of the conductive fences includes an opening that allows molding compound to flow through the opening.

Example 10: The hybrid shielding structure of any of Examples 1-9, wherein different sized openings are implemented in at least two of the conductive fences.

Example 11: The hybrid shielding structure of any of Examples 1-10, wherein larger openings are implemented in conductive fences that are positioned in proximity to radio frequency (RF) components whose sensitivity to electromagnetic interference is below a specified threshold value.

Example 12: An electronic device may include: a support structure, a printed circuit board (PCB) mounted to the support structure, wherein the PCB is to be overmolded with at least a portion of molding compound, the PCB including one or more electronic components disposed thereon, one or more conductive trenches disposed on the PCB, and one or more conductive fences disposed on the PCB, wherein the conductive trenches and the conductive fences provide an electromagnetic shield for at least a portion of at least one of the electronic components of the PCB.

Example 13: The electronic device of Example 12, wherein at least one of the conductive fences includes an opening that allows space for a soldering point on the PCB.

Example 14: The electronic device of any of Examples 12 and 13, wherein at least one of the conductive fences includes an opening that allows an antenna transmission line to be routed therethrough.

Example 15: The electronic device of any of Examples 12-14, wherein openings in the conductive fences are larger for conductive fences that are perpendicular to a flow of molding compound, and wherein openings in the conductive fences are smaller for conductive fences that are parallel to the flow of molding compound.

Example 16: The electronic device of any of Examples 12-15, wherein at least one of the conductive fences includes an interconnect to electrically link to a conductive trench disposed on the PCB.

Example 17: The electronic device of any of Examples 12-16, wherein the interconnect further electrically links to a conductive trench disposed on a top portion of at least one conductive fence.

Example 18: The electronic device of any of Examples 12-17, wherein the interconnect electrically links a ground layer to a conductive trench, a conductive fence, and a conformal outer coating.

Example 19: A method of manufacturing comprising: providing a printed circuit board that is to be overmolded with at least a portion of molding compound, the PCB including one or more electronic components disposed thereon, disposing one or more conductive trenches on the PCB, and disposing one or more conductive fences on the PCB, wherein the conductive trenches and the conductive fences provide an electromagnetic shield for at least a portion of at least one of the electronic components of the PCB.

Example 20: The method of manufacturing of claim 19, wherein the conductive trenches and the conductive fences are placed on the PCB according to a level of radio frequency (RF) sensitivity of one or more adjacent electronic components.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 800 in FIG. 8) or that visually immerses a user in an artificial reality (such as, e.g., virtual-reality system 900 in FIG. 9). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 8:
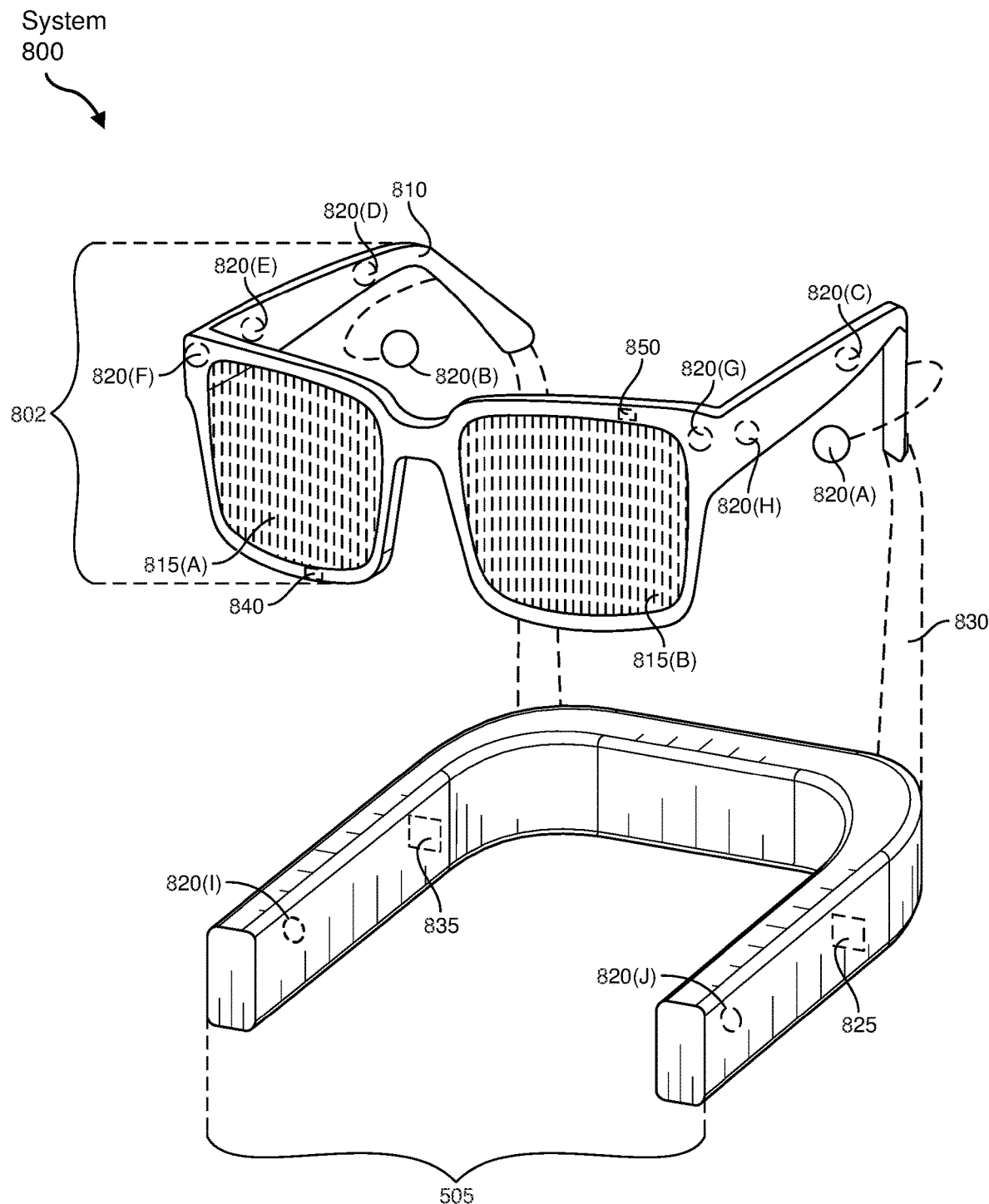
FIG. 8 is an illustration of exemplary augmented-reality glasses that may be used in connection with embodiments of this disclosure.

Turning to FIG. 8, augmented-reality system 800 may include an eyewear device 802 with a frame 810 configured to hold a left display device 815(A) and a right display device 815(B) in front of a user's eyes. Display devices 815(A) and 815(B) may act together or independently to present an image or series of images to a user. While augmented-reality system 800 includes two displays, embodiments of this disclosure may be implemented in augmented-reality systems with a single NED or more than two NEDs.

In some embodiments, augmented-reality system 800 may include one or more sensors, such as sensor 840. Sensor 840 may generate measurement signals in response to motion of augmented-reality system 800 and may be located on substantially any portion of frame 810. Sensor 840 may represent one or more of a variety of different sensing mechanisms, such as a position sensor, an inertial measurement unit (IMU), a depth camera assembly, a structured light emitter and/or detector, or any combination thereof. In some embodiments, augmented-reality system 800 may or may not include sensor 840 or may include more than one sensor. In embodiments in which sensor 840 includes an IMU, the IMU may generate calibration data based on measurement signals from sensor 840. Examples of sensor 840 may include, without limitation, accelerometers, gyroscopes, magnetometers, other suitable types of sensors that detect motion, sensors used for error correction of the IMU, or some combination thereof.

In some examples, augmented-reality system 800 may also include a microphone array with a plurality of acoustic transducers 820(A)-820(J), referred to collectively as acoustic transducers 820. Acoustic transducers 820 may represent transducers that detect air pressure variations induced by sound waves. Each acoustic transducer 820 may be configured to detect sound and convert the detected sound into an electronic format (e.g., an analog or digital format). The microphone array in FIG. 8 may include, for example, ten acoustic transducers: 820(A) and 820(B), which may be designed to be placed inside a corresponding ear of the user, acoustic transducers 820(C), 820(D), 820(E), 820(F), 820 (G), and 820(H), which may be positioned at various locations on frame 810, and/or acoustic transducers 820(1) and 820(J), which may be positioned on a corresponding neckband 805.

In some embodiments, one or more of acoustic transducers 820(A)-(J) may be used as output transducers (e.g., speakers). For example, acoustic transducers 820(A) and/or 820(B) may be earbuds or any other suitable type of headphone or speaker.

The configuration of acoustic transducers 820 of the microphone array may vary. While augmented-reality system 800 is shown in FIG. 8 as having ten acoustic transducers 820, the number of acoustic transducers 820 may be greater or less than ten. In some embodiments, using higher numbers of acoustic transducers 820 may increase the amount of audio information collected and/or the sensitivity and accuracy of the audio information. In contrast, using a lower number of acoustic transducers 820 may decrease the computing power required by an associated controller 850 to process the collected audio information. In addition, the position of each acoustic transducer 820 of the microphone array may vary. For example, the position of an acoustic transducer 820 may include a defined position on the user, a defined coordinate on frame 810, an orientation associated with each acoustic transducer 820, or some combination thereof.

Acoustic transducers 820(A) and 820(B) may be positioned on different parts of the user's ear, such as behind the pinna, behind the tragus, and/or within the auricle or fossa. Or, there may be additional acoustic transducers 820 on or surrounding the ear in addition to acoustic transducers 820 inside the ear canal. Having an acoustic transducer 820 positioned next to an ear canal of a user may enable the microphone array to collect information on how sounds arrive at the ear canal. By positioning at least two of acoustic transducers 820 on either side of a user's head (e.g., as binaural microphones), augmented-reality system 800 may simulate binaural hearing and capture a 3D stereo sound field around about a user's head. In some embodiments, acoustic transducers 820(A) and 820(B) may be connected to augmented-reality system 800 via a wired connection 830, and in other embodiments acoustic transducers 820(A) and 820(B) may be connected to augmented-reality system 800 via a wireless connection (e.g., a BLUETOOTH connection). In still other embodiments, acoustic transducers 820(A) and 820(B) may not be used at all in conjunction with augmented-reality system 800.

Acoustic transducers 820 on frame 810 may be positioned in a variety of different ways, including along the length of the temples, across the bridge, above or below display devices 815(A) and 815(B), or some combination thereof. Acoustic transducers 820 may also be oriented such that the microphone array is able to detect sounds in a wide range of directions surrounding the user wearing the augmented-reality system 800. In some embodiments, an optimization process may be performed during manufacturing of augmented-reality system 800 to determine relative positioning of each acoustic transducer 820 in the microphone array.

In some examples, augmented-reality system 800 may include or be connected to an external device (e.g., a paired device), such as neckband 805. Neckband 805 generally represents any type or form of paired device. Thus, the following discussion of neckband 805 may also apply to various other paired devices, such as charging cases, smart watches, smart phones, wrist bands, other wearable devices, hand-held controllers, tablet computers, laptop computers, other external compute devices, etc.

As shown, neckband 805 may be coupled to eyewear device 802 via one or more connectors. The connectors may be wired or wireless and may include electrical and/or non-electrical (e.g., structural) components. In some cases, eyewear device 802 and neckband 805 may operate independently without any wired or wireless connection between them. While FIG. 8 illustrates the components of eyewear device 802 and neckband 805 in example locations on eyewear device 802 and neckband 805, the components may be located elsewhere and/or distributed differently on eyewear device 802 and/or neckband 805. In some embodiments, the components of eyewear device 802 and neckband 805 may be located on one or more additional peripheral devices paired with eyewear device 802, neckband 805, or some combination thereof.

Pairing external devices, such as neckband 805, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 800 may be provided by a paired device or shared between a paired device and an eyewear device, thus reducing the weight, heat profile, and form factor of the eyewear device overall while still retaining desired functionality. For example, neckband 805 may allow components that would otherwise be included on an eyewear device to be included in neckband 805 since users may tolerate a heavier weight load on their shoulders than they would tolerate on their heads. Neckband 805 may also have a larger surface area over which to diffuse and disperse heat to the ambient environment. Thus, neckband 805 may allow for greater battery and computation capacity than might otherwise have been possible on a stand-alone eyewear device. Since weight carried in neckband 805 may be less invasive to a user than weight carried in eyewear device 802, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 805 may be communicatively coupled with eyewear device 802 and/or to other devices. These other devices may provide certain functions (e.g., tracking, localizing, depth mapping, processing, storage, etc.) to augmented-reality system 800. In the embodiment of FIG. 8, neckband 805 may include two acoustic transducers (e.g., 820(1) and 820(J)) that are part of the microphone array (or potentially form their own microphone subarray). Neckband 805 may also include a controller 825 and a power source 835.

Acoustic transducers 820(1) and 820(J) of neckband 805 may be configured to detect sound and convert the detected sound into an electronic format (analog or digital). In the embodiment of FIG. 8, acoustic transducers 820(1) and 820(J) may be positioned on neckband 805, thereby increasing the distance between the neckband acoustic transducers 820(1) and 820(J) and other acoustic transducers 820 positioned on eyewear device 802. In some cases, increasing the distance between acoustic transducers 820 of the microphone array may improve the accuracy of beamforming performed via the microphone array. For example, if a sound is detected by acoustic transducers 820(C) and 820(D) and the distance between acoustic transducers 820(C) and 820 (D) is greater than, e.g., the distance between acoustic transducers 820(D) and 820(E), the determined source location of the detected sound may be more accurate than if the sound had been detected by acoustic transducers 820(D) and 820(E).

Controller 825 of neckband 805 may process information generated by the sensors on neckband 805 and/or augmented-reality system 800. For example, controller 825 may process information from the microphone array that describes sounds detected by the microphone array. For each detected sound, controller 825 may perform a direction-of-arrival (DOA) estimation to estimate a direction from which the detected sound arrived at the microphone array. As the microphone array detects sounds, controller 825 may populate an audio data set with the information. In embodiments in which augmented-reality system 800 includes an inertial measurement unit, controller 825 may compute all inertial and spatial calculations from the IMU located on eyewear device 802. A connector may convey information between augmented-reality system 800 and neckband 805 and between augmented-reality system 800 and controller 825. The information may be in the form of optical data, electrical data, wireless data, or any other transmittable data form. Moving the processing of information generated by augmented-reality system 800 to neckband 805 may reduce weight and heat in eyewear device 802, making it more comfortable to the user.

Power source 835 in neckband 805 may provide power to eyewear device 802 and/or to neckband 805. Power source 835 may include, without limitation, lithium ion batteries, lithium-polymer batteries, primary lithium batteries, alkaline batteries, or any other form of power storage. In some cases, power source 835 may be a wired power source. Including power source 835 on neckband 805 instead of on eyewear device 802 may help better distribute the weight and heat generated by power source 835.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 900 in FIG. 9, that mostly or completely covers a user's field of view. Virtual-reality system 900 may include a front rigid body 902 and a band 904 shaped to fit around a user's head. Virtual-reality system 900 may also include output audio transducers 906(A) and 906(B). Furthermore, while not shown in FIG. 9, front rigid body 902 may include one or more electronic elements, including one or more electronic displays, one or more inertial measurement units (IMUS), one or more tracking emitters or detectors, and/or any other suitable device or system for creating an artificial-reality experience.

Artificial-reality systems may include a variety of types of visual feedback mechanisms. For example, display devices in augmented-reality system 800 and/or virtual-reality system 900 may include one or more liquid crystal displays (LCDs), light emitting diode (LED) displays, microLED displays, organic LED (OLED) displays, digital light projector (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 800 and/or virtual-reality system 900 may include microLED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 800 and/or virtual-reality system 900 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

Figure 9:
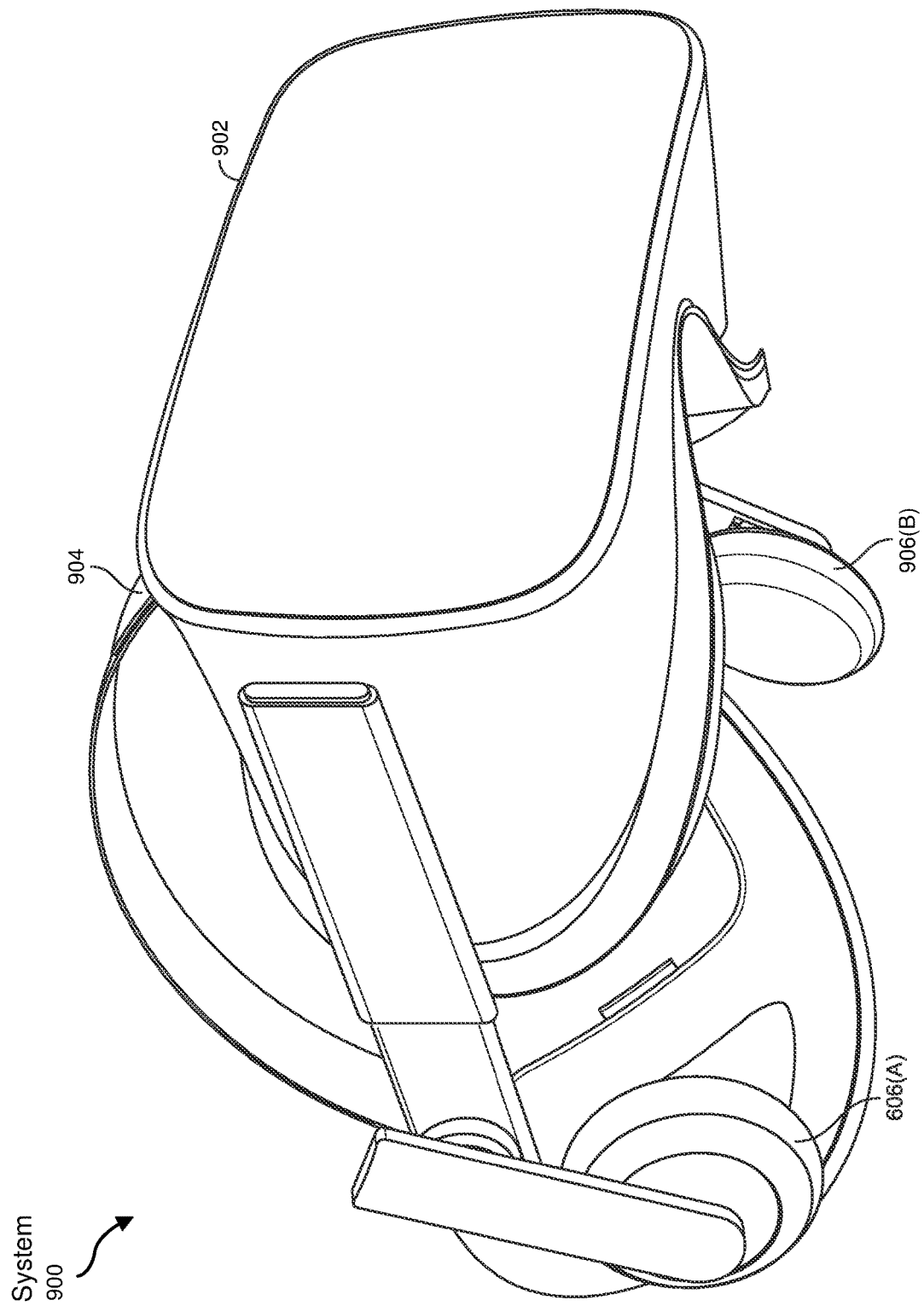
FIG. 9 is an illustration of an exemplary virtual-reality headset that may be used in connection with embodiments of this disclosure.

FIGS. 10A and 10B illustrate a smartwatch 1000 that may be used in isolation or in conjunction with other systems including artificial-reality (AR) systems 800 or 900 of FIG. 8 or 9 above. In some cases, the smartwatch 1000 may include various types of antennas including WiFi, global positioning system (GPS), cellular, Bluetooth, or other antennas. Still further, the smartwatch 1000 may include sensors such as image sensors, inertial measurement units (IMUS), or other sensors. These sensors may be used, for example, to enhance an AR application running on the AR system. Further, the watch band may include sensors that measure biometrics of the user. For example, the watch band may include neuromuscular sensors disposed on an inside surface of the watch band contacting the user that detects the muscle intentions of the user. The AR system may operate in conjunction with the neuromuscular sensors to overlay one or more visual indicators on or near an object within the AR environment such that the user could perform "enhanced" or "augmented" interactions with the object.

FIGS. 10A and 10B illustrate an embodiment of a smartwatch 1000 that includes a watch band and a watch body. In some cases, neuromuscular sensors may be integrated within the smartwatch. FIG. 10A illustrates an example wristband system 1000 that includes a watch body 1004 coupled to a watch band 1012. Watch body 1004 and watch band 1012 may have any size and/or shape that is configured to allow a user to wear wristband system 1000 on a body part (e.g., a wrist). Wristband system 1000 may include a retaining mechanism 1013 (e.g., a buckle) for securing watch band 1012 to the user's wrist. Wristband system 1000 may also include a coupling mechanism 1006, 1010 for detachably coupling watch body 1004 to watch band 1012. Still further, the wristband system 1000 may include a button or wheel 1008 that allows users to interact with the wristband system 1000 including applications that run on the system.

Wristband system 1000 may perform various functions associated with the user. The functions may be executed independently in watch body 1004, independently in watch band 1012, and/or in communication between watch body 1004 and watch band 1012. Watch band 1012 and its associated antennas may be configured to operate independently (e.g., execute functions independently) from watch body 1004. Additionally or alternatively, watch body 1004 and its associated antennas may be configured to operate independently (e.g., execute functions independently) from watch band 1012. At least in some cases, watch band 1012 and/or watch body 1004 may each include the independent resources required to independently execute functions. For example, watch band 1012 and/or watch body 1004 may each include a power source (e.g., a battery), a memory, data storage, a processor (e.g., a CPU), communications (including multiple different types of antennas), a light source (e.g., at least one infrared LED for tracking watch body 1004 and/or watch band 1012 in space with an external sensor), and/or input/output devices.

FIG. 10B illustrates an example wristband system 1000 that includes a watch body 1004 decoupled from a watch band 1012. Watch band 1012 may be donned (e.g., worn) on a body part (e.g., a wrist) of a user and may operate independently from watch body 1004. For example, watch band 1012 may be configured to be worn by a user and an inner surface of watch band 1012 may be in contact with the user's skin. When worn by a user, sensor 1014 may be in contact with the user's skin. Sensor 1014 may be a biosensor that senses a user's heart rate, bioimpedance, saturated oxygen level, temperature, sweat level, muscle intentions, steps taken, or a combination thereof. Watch band 1012 may include multiple sensors 1014 and 1016 that may be distributed on an inside surface, in an interior volume, and/or on an outside surface of watch band 1012. In some examples, watch body 1004 may include an electrical connector 1018 that mates with connector 1020 of watch band 1012 for wired communication and/or power transfer. In some examples, as will be described further below, watch body 1004 and/or watch band 1012 may include wireless communication devices including LTE antennas, GPS antennas, Bluetooth antennas, WiFi antennas, NFC antennas, or other types of antennas.

As illustrated in FIG. 10B, in some examples, watch body 1004 may include front-facing image sensor 1015A and rear-facing image sensor 1015B. Front-facing image sensor 1015A may be located in a front face of watch body 1004 (e.g., substantially near, under, or on the display 1002), and rear-facing image sensor 1015B may be located in a rear face of watch body 1004. In some examples, a level of functionality of at least one of watch band 1012 or watch body 1004 may be modified when watch body 1004 is detached from watch band 1012. The level of functionality that may be modified may include the functionality of front-facing image sensor 1015A and/or rear-facing image sensor 1015B. Alternatively, the level of functionality may be modified to change how the various antennas within the system. For instance, as will be described further below, the embodiments herein may include a cosmetic RF transparent feature that may form a functional link between wrist strap antennas and internal electronic components including tuners, amplifiers, controllers, and data processors.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A hybrid shielding structure comprising:
a printed circuit board (PCB) that is to be overmolded with at least a portion of molding compound, the PCB including one or more electronic components disposed thereon;
one or more conductive trenches disposed on the PCB; and
one or more conductive fences disposed on the PCB,
wherein the conductive trenches and the conductive fences provide an electromagnetic shield for at least a portion of at least one of the electronic components of the PCB, and
wherein a conductive material is applied to at least a portion of the overmolded PCB and to the conductive trenches and conductive fences to form a conformal conductive outer coating for the hybrid shielding structure.

2. The hybrid shielding structure of claim 1, wherein at least one of the conductive fences includes a trench formed into a top portion thereof.

3. The hybrid shielding structure of claim 2, wherein the trench formed in the top portion of the conductive fence is filled with a conductive material.

4. The hybrid shielding structure of claim 1, further comprising: one or more conductive ground layers of the PCB that are electrically connected to the conformal outer coating.

5. The hybrid shielding structure of claim 1, wherein the conformal outer coating electrically links a plurality of the conductive fences.

6. The hybrid shielding structure of claim 1, wherein the conformal outer coating electrically links one or more sides of the PCB to each other.

7. The hybrid shielding structure of claim 1, wherein at least one of the conductive fences includes an opening that allows molding compound to flow through the opening.

8. The hybrid shielding structure of claim 7, wherein different sized openings are implemented in at least two of the conductive fences.

9. The hybrid shielding structure of claim 8, wherein larger openings are implemented in conductive fences that are positioned in proximity to radio frequency (RF) components whose sensitivity to electromagnetic interference is below a specified threshold value.

10. The hybrid shielding structure of claim 8, wherein smaller openings or a lack of openings are implemented in conductive fences that are positioned in proximity to sensitive RF components whose sensitivity to electromagnetic interference is above a specified threshold value.

11. An electronic device comprising:
a printed circuit board (PCB) that is to be overmolded with at least a portion of molding compound, the PCB including one or more electronic components disposed thereon;
one or more conductive trenches disposed on the PCB; and
one or more conductive fences disposed on the PCB,
wherein the conductive trenches and the conductive fences provide an electromagnetic shield for at least a portion of at least one of the electronic components of the PCB, and
wherein a conductive material is applied to at least a portion of the overmolded PCB and to the conductive trenches and conductive fences to form a conformal conductive outer coating for the electronic device.

12. The electronic device of claim 11, wherein at least one of the conductive fences includes one or more openings that allow space for a soldering point on the PCB.

13. The electronic device of claim 11, wherein at least one of the conductive fences includes one or more openings that allow an antenna transmission line to be routed therethrough.

14. The electronic device of claim 11, wherein openings in the conductive fences are larger for conductive fences that are perpendicular to a flow of molding compound, and wherein openings in the conductive fences are smaller or are omitted for conductive fences that are parallel to the flow of molding compound.

15. The electronic device of claim 11, wherein at least one of the conductive fences includes an interconnect to electrically link to a conductive trench disposed on the PCB.

16. The electronic device of claim 15, wherein the interconnect further electrically links to a conductive trench disposed on a top portion of at least one conductive fence.

17. The electronic device of claim 15, wherein the interconnect electrically links a ground layer to a conductive trench, a conductive fence, and a conformal outer coating.

18. A method of manufacturing comprising:
providing a printed circuit board that is to be overmolded with at least a portion of molding compound, the PCB including one or more electronic components disposed thereon;
disposing one or more conductive trenches on the PCB; and
disposing one or more conductive fences disposed on the PCB,
wherein the conductive trenches and the conductive fences provide an electromagnetic shield for at least a portion of at least one of the electronic components of the PCB, and
wherein a conductive material is applied to at least a portion of the overmolded PCB and to the conductive trenches and conductive fences to form a conformal conductive outer coating for the overmolded PCB and the electronic components.

19. The method of manufacturing of claim 18, wherein the conductive trenches and the conductive fences are placed on the PCB according to a level of radio frequency (RF) sensitivity and RF mutual coupling of one or more adjacent electronic components.

20. The method of manufacturing of claim 18, wherein at least one of the conductive fences includes a trench at least partially filled with conductive material formed into a top portion thereof.

* * * * *